US009293986B2

(12) United States Patent
Thandri et al.

(10) Patent No.: US 9,293,986 B2
(45) Date of Patent: Mar. 22, 2016

(54) REDUCING KICKBACK CURRENT TO POWER SUPPLY DURING CHARGE PUMP MODE TRANSITIONS

(71) Applicant: Cirrus Logic, Inc., Austin, TX (US)

(72) Inventors: Bharath Kumar Thandri, Austin, TX (US); Thuan L. Nguyen, Austin, TX (US); Daniel John Allen, Austin, TX (US); Lingli Zhang, Austin, TX (US); Aniruddha Satoskar, Austin, TX (US); Aaron Brennan, Austin, TX (US); Dan Shen, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 45 days.

(21) Appl. No.: 14/108,101

(22) Filed: Dec. 16, 2013

(65) Prior Publication Data
US 2014/0340158 A1 Nov. 20, 2014

Related U.S. Application Data

(60) Provisional application No. 61/873,301, filed on Sep. 3, 2013, provisional application No. 61/824,677, filed on May 17, 2013.

(51) Int. Cl.
*H03F 1/30* (2006.01)
*H02M 3/07* (2006.01)
*H03F 1/02* (2006.01)

(52) U.S. Cl.
CPC *H02M 3/07* (2013.01); *H03F 1/025* (2013.01)

(58) Field of Classification Search
CPC ............... H03F 1/30; H03F 3/04; H03F 3/20; H03G 3/30
USPC .......................................... 330/297, 285, 296
See application file for complete search history.

(56) References Cited

U.S. PATENT DOCUMENTS

| 6,055,168 | A | 4/2000 | Kotowski et al. |
| 6,169,673 | B1 | 1/2001 | McIntyre et al. |
| 6,198,645 | B1 | 3/2001 | Kotowski et al. |
| 6,563,235 | B1 | 5/2003 | McIntyre et al. |
| 6,753,623 | B2 | 6/2004 | McIntyre et al. |
| 7,456,677 | B1 | 11/2008 | Rao et al. |
| 7,474,141 | B2 | 1/2009 | Huang et al. |
| 7,557,641 | B2 | 7/2009 | Georgescu et al. |

(Continued)

OTHER PUBLICATIONS

International Search Report and Written Opinion mailed Sep. 11, 2014, during prosecution of related International Application No. PCT/US2014/0037725.

*Primary Examiner* — Henry Choe
(74) *Attorney, Agent, or Firm* — Norton Rose Fulbright US LLP

(57) ABSTRACT

Kickback current from a charge pump to a power management integrated circuit (PMIC) may be reduced by dissipating charge from fly and hold capacitors during mode transitions. A switch may be placed in series between the charge pump and the PMIC to disconnect the charge pump and prevent kickback current from reaching the PMIC. Further, additional loads, as switches, may be coupled to the charge pump outputs to dissipate charge from the fly and hold capacitors. Additionally, a closed feedback loop may be used to monitor and discharge excess charge from the fly and hold capacitors during mode transitions. Furthermore, charge may be redistributed between the fly and hold capacitors during mode transitions to reduce the time period of the transition.

34 Claims, 13 Drawing Sheets

(56) References Cited

U.S. PATENT DOCUMENTS

| | | |
|---|---|---|
| 7,746,155 B2 | 6/2010 | Labbe |
| 7,999,601 B2 * | 8/2011 | Schlueter et al. ............. 327/383 |
| 8,022,749 B2 * | 9/2011 | Schatzberger et al. ....... 327/536 |
| 8,068,622 B2 * | 11/2011 | Melanson et al. ............ 381/120 |
| 8,093,941 B2 | 1/2012 | Hunter et al. |
| 8,493,141 B2 * | 7/2013 | Khlat et al. .................. 330/127 |
| 2002/0008499 A1 | 1/2002 | Henry |
| 2003/0085752 A1 | 5/2003 | Rader et al. |
| 2006/0063555 A1 | 3/2006 | Robbins |
| 2007/0146051 A1 | 6/2007 | Tsen |
| 2010/0277152 A1 | 11/2010 | MacFarlane |
| 2011/0022859 A1 | 1/2011 | More et al. |
| 2011/0062912 A1 | 3/2011 | Yang et al. |
| 2011/0084757 A1 | 4/2011 | Saman et al. |
| 2011/0204961 A1 | 8/2011 | Galal et al. |
| 2012/0163632 A1 | 6/2012 | Lesso et al. |
| 2012/0170770 A1 | 7/2012 | Lesso et al. |
| 2012/0249224 A1 | 10/2012 | Wei et al. |
| 2012/0313695 A1 | 12/2012 | Prabhu et al. |
| 2013/0009696 A1 | 1/2013 | Brown |
| 2013/0069614 A1 * | 3/2013 | Tso et al. ...................... 323/288 |

* cited by examiner

REDUCING KICKBACK CURRENT TO POWER SUPPLY DURING CHARGE PUMP MODE TRANSITIONS

CROSS-REFERENCE TO RELATED APPLICATIONS

This application claims priority to U.S. Provisional Patent Application No. 61/873,301 to Bharath K. Thandri et al. filed on Sep. 3, 2013 and entitled "REDUCING KICKBACK CURRENT TO POWER SUPPLY DURING CHARGE PUMP MODE TRANSITIONS" and claims priority to U.S. Provisional Patent Application No. 61/824,677 filed on May 17, 2013, both of which are hereby incorporated by reference in their entirety.

FIELD OF THE DISCLOSURE

The instant disclosure relates to integrated circuits. In particular, the instant disclosure relates to amplifiers.

BACKGROUND

In a typical Class H amplifier system 100, a charge pump 104, that can produce either +/− charge pump voltage VCP ("+/−VCP") or +/−½ charge pump voltage VCP ("+/−VCP/2") or +/−⅓ charge pump voltage VCP ("+/−VCP/3") or +/−1.33 charge pump voltage VCP ("+/−4/3*VCP") or some other voltage level, is used to power a headphone amplifier. FIG. 1 shows a conventional class H amplifier system 100 with a charge pump 104 and headphone amplifier 106 driving a headphone load 110. Class H control block 108 controls charge pump 104 and headphone amplifier 106 for driving the headphone load as shown in FIG. 1.

The charge pump 104 consists of a network of switches (not shown) controlled by a clock and generates a positive supply voltage (VDDCP) and a negative supply voltage (VSSCP), which are used as supplies for the ground centered headphone amplifier. The class H control block 108 determines the mode of operation for charge pump 104 based on the magnitude of an audio signal provided to the headphone load 110. One supply voltage, VCP, for the charge pump 104 in mobile applications is 1.8 V, and different modes of the charge pump 104: +/−VCP (1.8 V mode) is shown as "mode 1,"+/−VCP/2 (0.9 V mode) is shown as "mode 2,"+/−VCP/3 (0.6 V mode) is shown as "mode 3,"+/−4*VCP/3 (2.4 V mode) is "mode 4." Each mode of the charge pump 104 may involve setting a different combination of the network of switches to be on or off. External pumping fly capacitors 112 ($C_{fly1}$) and 114 ($C_{fly2}$), which are external to the charge pump 104, may be 2.2 uF. External hold capacitors 116 ($C_{hold1}$) and 118 ($C_{hold2}$) may be 2.2 uF.

An external power management integrated circuit (PMIC) 102 generates the charge pump voltage VCP, such as from a supply voltage VP of a battery (not shown), and may be an inductor-based buck converter or low dropout regulator. In steady state operation, the charges on capacitors 112, 114, 116, and 118 settle to their respective designed value. For example, when the charge pump operates in mode 1 (1.8V mode) at steady state, the charge held by capacitor 112 is 0, while the charges for capacitors 116, 114, and 118 is each 1.8*2.2 uF. However, when the charge pump 104 operates in mode 2 (0.9V mode) at steady state, the charges on all four capacitors 112, 114, 116, and 118 is each 0.9*2.2 uF. The charges held by each of the four capacitors 112, 114, 116, and 118 is 0.6*2.2 uF in mode 3. In mode 4, the charge held by capacitor 112 is 0, while the charges for capacitors 114, 116, and 118 is each 2.4*2.2 uF. The charge difference between modes depends on the charge pump 104 configuration before and after the mode transition.

During charge pump mode transitions, the difference in charge on the capacitors 112, 114, 116, and 118 is provided by the current from power supply voltage VP or VCP. As shown in FIG. 2, for a mode transition from a lower to higher supply, such as from 0.6 V to 0.9 V, 0.9 V to 1.8 V, or 1.8 V to 2.4 V, a final mode has a higher amount of charge on the capacitors 112, 114, 116, and 118 than a starting mode. In any of these positive voltage slope transitions (with respect to voltage VDDCP), instantaneous current is drawn from the voltage supply VCP/VP to charge the capacitors 112, 114, 116, and 118. For a mode transition from higher to lower supply, such as from 2.4 V to 1.8 V, 1.8 V to 0.9 V, or 0.8 V to 0.6 V, a final mode has a lower amount of charge on the capacitors 112, 114, 116, and 118 than a starting mode. In any of the negative voltage slope transitions (with respect to voltage VDDCP), excess charge will push current to the voltage supply VCP/VP, if the charge is not dissipated internally in the charge pump 104 or other component of an integrated circuit. In both positive and negative voltage slope transitions, the current that is drawn from or pushed to the supply is abrupt and large (in the order of hundreds of milli-amps), because such transitions involve charging/discharging relatively large external capacitors. When the PMIC 102 cannot react to the sudden change in current, the supply voltage may also change abruptly, causing potential reliability concerns.

Shortcomings mentioned here are only representative and are included simply to highlight that a need exists for improved amplifier systems, particularly for consumer-level devices. Embodiments described here address certain shortcomings but not necessarily each and every one described here or known in the art.

SUMMARY

Techniques proposed in this disclosure mitigate kickback current during the charge pump mode transitions from a higher voltage mode to a lower voltage mode and ensure reliable system operation.

In certain embodiments, the return current problem from a charge pump to a controller, such as a power management integrated circuit, may be reduced when switching from high output to low output. For example, in one embodiment, the charge pump may be disconnected from the power supply, and the charge pump switched to run in a lower voltage mode without the power supply (e.g., by using a residue charge). The load current then drains one or more outputs of the charge pump. When charge pump output decreases to a lower value, the charge pump may be reconnected to the power supply.

In another embodiment, a charge pump may have a positive and a negative voltage output. The controller may disconnect the charge pump from the power supply as described above and allow the load current to drain the charge pump outputs. The controller may also switch one capacitor in parallel with the positive output in a first phase, and switch the same capacitor in parallel with the negative output in a different second phase until both positive and negative output decrease to a lower voltage value. The charge pump may be reconnected to the power supply after that.

In further embodiments, the charge pump controller may disconnect the charge pump from the power supply as described above. The controller will put the charge pump in a discharge state and allow the load current drain the charge pump fly and/or hold capacitors. In this embodiment, charge pump may be reconnected to the power supply after either the positive or negative voltage output of the charge pump reaches a target value. Alternatively, the controller may be enabled after both the positive and negative voltage outputs of the charge pump reach a target value. In another alternative, the controller may wait until either the positive or the negative voltage output of the charge pump reaches a target value, then the controller may quickly discharge the output that has not reached the target value.

In one embodiment, an open loop solution may drain fly and/or hold capacitors through drain paths coupled to the positive and negative voltage outputs of the charge pump. These drain paths may be activated through switches coupled to the charge pump outputs. Further, additional switches may be coupled between nodes of the charge pump to allow redistribution of charge between fly and hold capacitors.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 3:
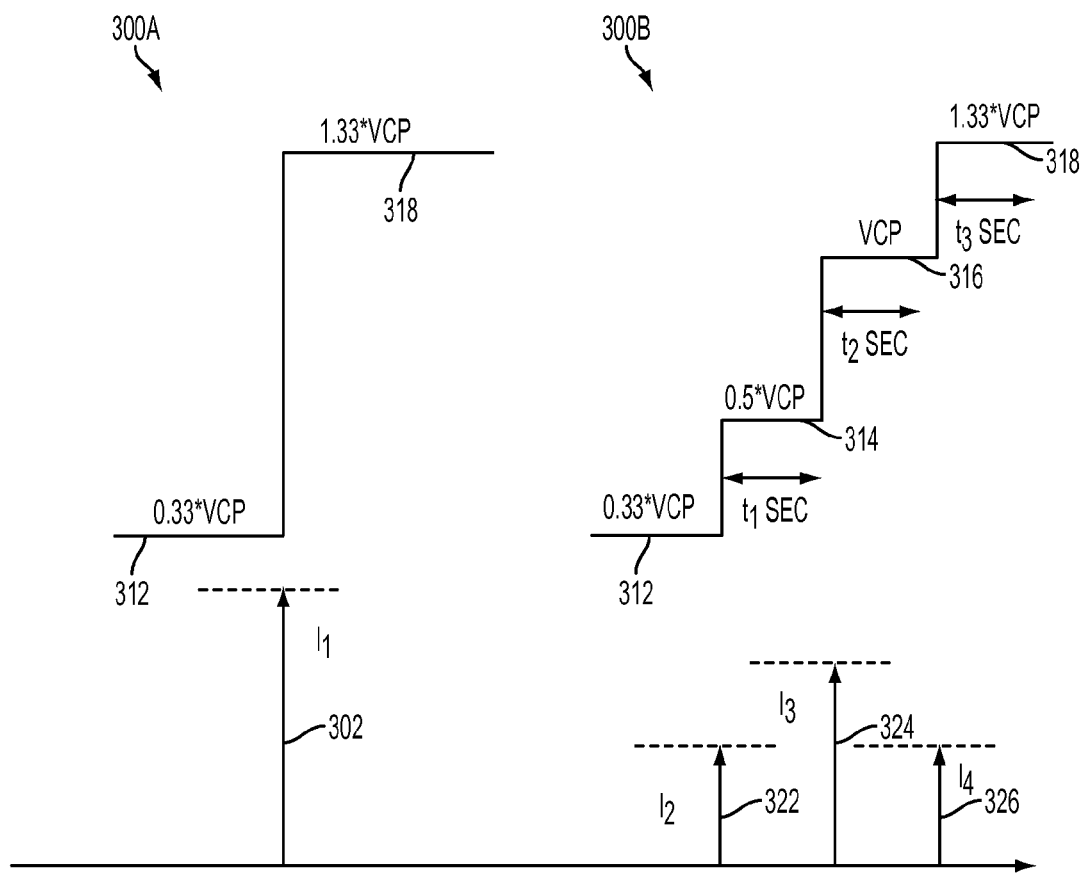
FIG. 3 is a graph illustrating an exemplary mode change to a higher voltage mode with intermediate steps according to one embodiment of the disclosure.

A mode sequencing algorithm may allow charge pump voltage transitions to progress through intermediate voltage steps before reaching a final output voltage. Sequencing through intermediate voltage steps may apply to either positive and/or negative voltage transitions. FIG. 3 is a graph illustrating an exemplary mode change to a higher voltage mode with intermediate steps according to one embodiment of the disclosure.

Figure 1:
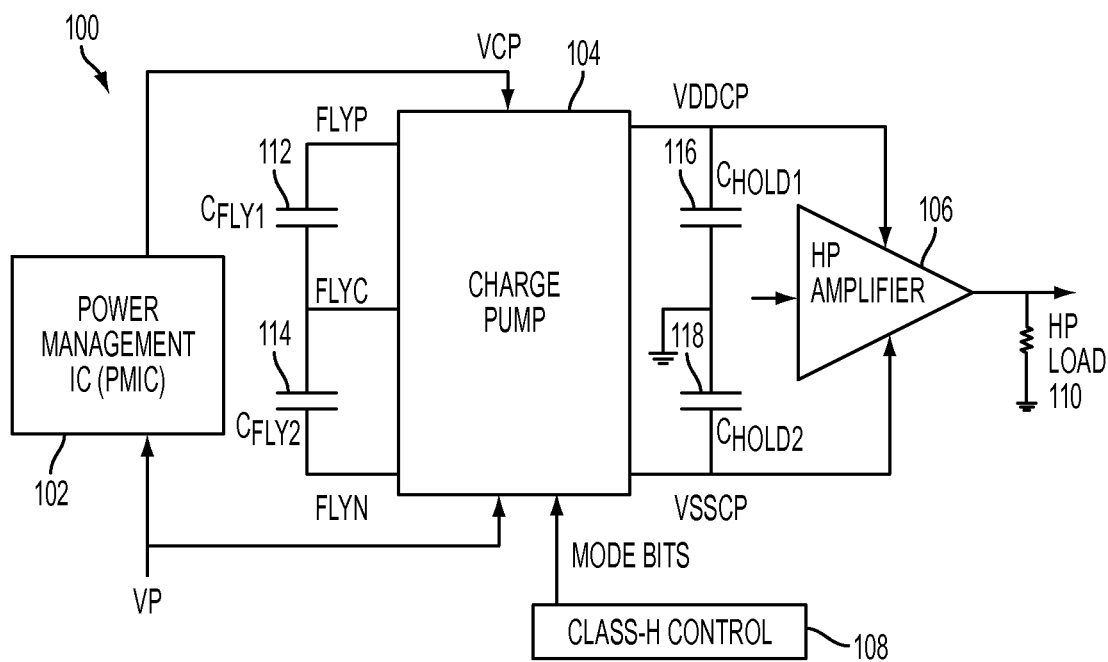
FIG. 1 is block diagram illustrating a conventional class H amplifier.
Figure 2:
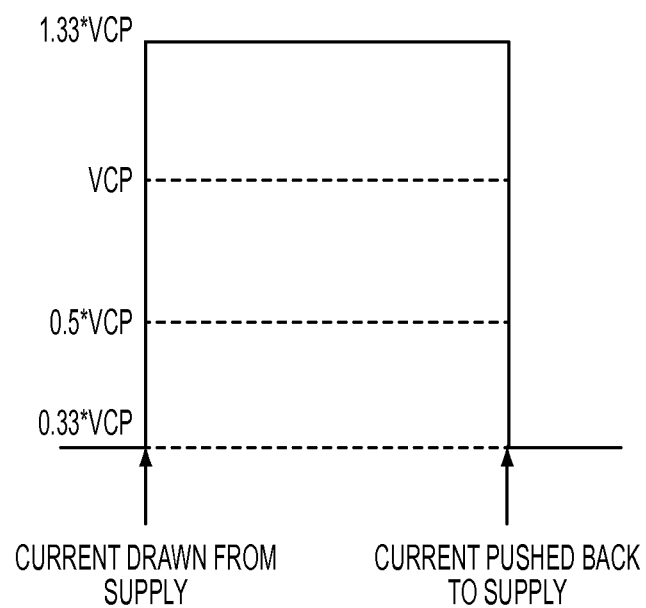
FIG. 2 is a graph illustrating a mode change from one mode to another mode of a conventional class H amplifier.

FIG. 3 shows a comparison of lower to higher voltage transitions of the a charge pump output voltage, such as VDDCP, both without mode transition in graph 300A and with mode transitions in graph 300B. FIG. 3 also illustrates the respective supply currents drawn from the charge pump in line 302 for sequence 300A and lines 322, 324, and 326 for sequence 300B. When a control block, such as the class H control block 108 of FIG. 1, initiates transition from the 0.6 V mode 312 to the 2.4 V mode 318, the charge pump first transitions to 0.9 V mode 314 and holds mode 314 for a certain time, such as $t_1$ seconds, to ensure charge pump supply voltages to approximately settle. The charge pump then goes to 1.8 V mode 316 and holds in the 1.8 V mode 316 for $t_2$ seconds. Then, the charge pump goes to the target 2.4 V mode 318. The supply current for the direct 0.6 V to 2.4 V mode transition is large, because a large current 302, $I_1$, results from the difference in charge between the two modes 312 and 318. With mode sequencing applied as in sequence 300B, the current for the transition from the 0.6 V mode 312 to 0.9 V mode 314, current 322, $I_2$, for the transition from the 0.9 V mode 314 to 1.8 V mode 316, current 324, $I_3$, and the transition from the 1.8 V mode 316 to 2.4 V mode 318, current 326, $I_4$, are each much lower than the current 302, $I_1$.

The sequenced voltage steps of sequence 300B reduce the instantaneous current step and provide a more staggered current drain for each successive transition from the voltage supplies. FIG. 3 shows the output mode for a charge pump with a single output node. When a charge pump includes two output nodes, such as a positive voltage output VDDCP and negative voltage output VSSCP, similar transitions may be performed on the second output node.

Figure 4:
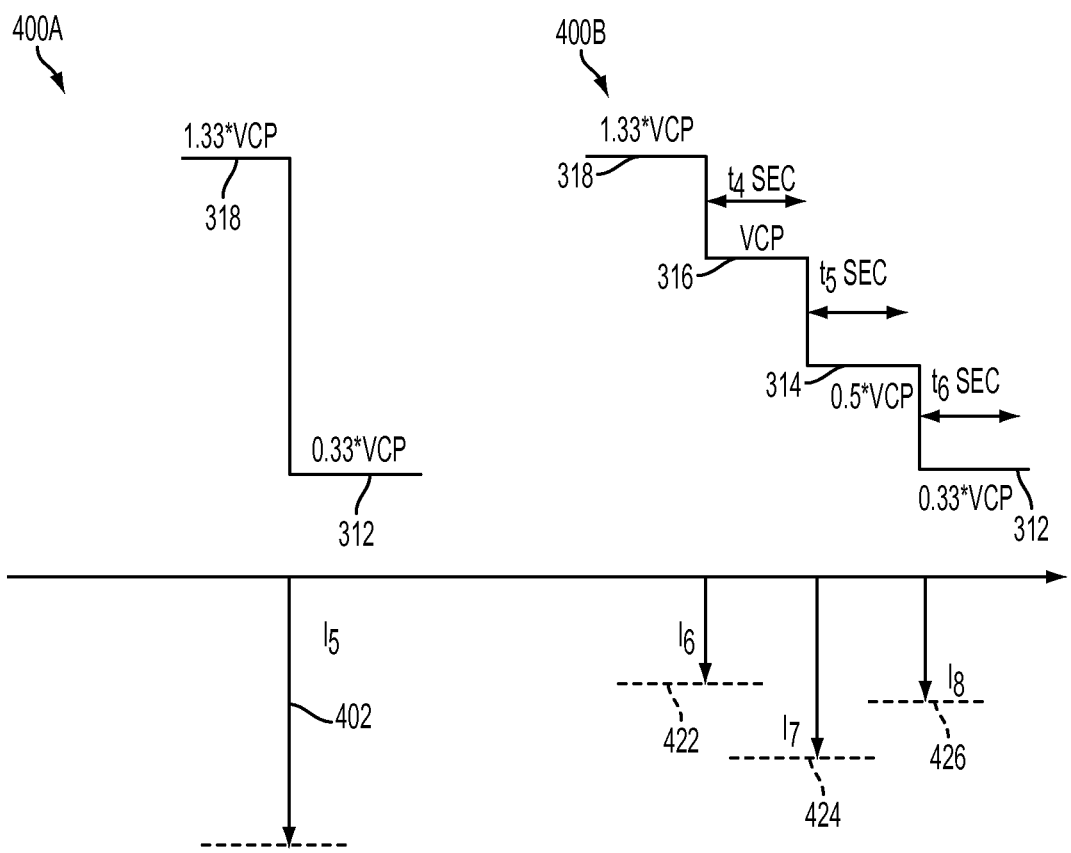
FIG. 4 is a graph illustrating an exemplary mode change to a lower voltage mode with intermediate steps according to one embodiment of the disclosure.

Similar results may be applied by sequencing mode steps from a higher to a lower charge pump output voltage as with sequencing mode steps from a lower to a higher charge pump output voltage. FIG. 4 is a graph illustrating an exemplary mode change to a lower voltage mode with intermediate steps according to one embodiment of the disclosure. FIG. 4 shows a comparison of example higher to lower voltage transitions of a charge pump output, such as VDDCP, both without mode transition in the sequence 400A and with mode transition in the sequence 400B. The respective supply currents for the sequence 400A are shown in line 402 and for the sequence 400B in lines 422, 424, and 426. When a control block, such as the class H control block 108 of FIG. 1, decides to transition the charge pump from the 2.4 V mode 318 to the 0.6 V mode 312, the charge pump 104 transitions first to the 1.8 V mode 316 and holds there for a certain time, $t_4$ seconds, to allow the charge pump supply voltages to approximately settle. Then, the charge pump transitions to the 0.9 V mode 314 and holds that mode for $t_5$ seconds. After that, the charge pump transitions to the target 0.6 V mode 312.

The current 402, $I_5$, for the direct 2.4 V to 0.6 V mode transition of sequence 400A is approximately proportional to a value of excess charge on the fly and hold capacitors that is not dissipated by the integrated circuit that encompasses the charge pump. This current may be pushed back to the voltage supply. The current 402, $I_5$, is negative because the current is pushed back to, instead of being drawn from, the voltage supply. In contrast, the current 302, $I_1$, of FIG. 3 is positive because the current 302, $I_1$, is drawn from the voltage supply. With mode sequencing applied as shown in sequence 400B, the amount of current pushed back for each of the 2.4 V mode 318 transition to the 1.8 V mode 316 in the current 422, $I_6$, the 1.8 V mode 316 transition to 0.9 V mode 314 in the current 424, $I_7$, and the 0.9 V mode 314 transition to 0.6 V mode 312 in the current 426, $I_8$, is each much lower than the current 402, $I_5$. The magnitude of supply voltage excursions due to current pushed back to the voltage supply is reduced because the currents pushed back are staggered with each successive transition. Although FIG. 4 only illustrates mode transitions for one output of a charge pump, transitions from a higher to lower voltage mode may also be implemented on a second output of the charge pump. Additionally, although only four modes are shown in the sequences 300B of FIGS. 3 and 400B of FIG. 4, additional or fewer modes may be implemented in the sequences.

The mode sequencing method with transition modes described with reference to FIGS. 3 and 4 may reduce abrupt changes in supply voltage and current during the charge pump mode transitions by staggering the instantaneous change into smaller changes.

During transitions, each mode may be held for a different duration of time in an asymmetric ramp sequence. The asymmetric ramp rate method may provide safe playback of audio signals without any clipping through mode sequencing of charge pump mode transitions. When the signal level changes from a minimum level to a maximum level and then back to a minimum level, the charge pump may transition from the 0.6 V mode 312 to 2.4 V mode 318 and then back to the 0.6 V mode 312 of FIG. 4. The entire transition with intermediate steps and asymmetric sequencing is shown in FIG. 5.

Figure 5:
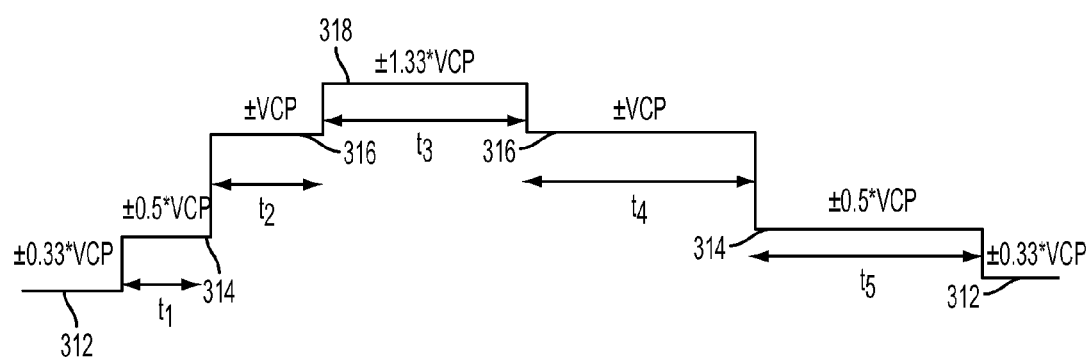
FIG. 5 is a graph illustrating asymmetric mode transitions with intermediate steps according to one embodiment of the disclosure.

FIG. 5 is a graph illustrating an exemplary mode change to a higher voltage mode and to a lower voltage mode with asymmetric intermediate steps according to one embodiment of the disclosure. Two observations about audio playback during mode transitions are discussed to help explain the asymmetric ramp rates. The first observation is that signal clipping may create an issue when a signal amplitude at a headphone load, such as headphone load 110 of FIG. 1, increases from a smaller to higher value. When intermediate modes are available, such as described above in FIGS. 3 and 4, the headphone amplifier may respond by changing the charge pump mode to a higher value from a lower value. The response time of the mode sequencing may affect lower to higher voltage transitions, because the response time affects whether the audio signal clips during the transition time. The second observation is that if the charge pump mode is in a higher voltage mode for too long, efficiency may be lost during that time period. However, the lower efficiency may be easier to tolerate in the design of the amplifier system than clipping. Thus, asymmetric ramp times may be implemented to reduce clipping in low to high transitions.

During positive transitions, the charge pump may attempt to transition quickly to reduce clipping. Settling at an charge pump output for a mode follows the resistor-capacitor (RC) time constant where $R_{pos}*C_{hold1}$ determines the charge pump positive voltage output, VDDCP, time constant and $R_{neg}*C_{hold2}$ determines the charge pump negative voltage output, VSSCP, where $R_{pos}$ denotes the effective average resistance, including switch and routing, looking into the VDDCP node, and $R_{neg}$ denotes the effective average resistance, including switch and routing, looking into the VSSCP node. The worst case time constant over process, voltage, and temperature corners the for VDDCP and VSSCP nodes may be the minimum time that the charge pump holds in an intermediate mode during the mode transition.

During negative transitions, there may be excess charge on the fly and/or hold capacitors when the charge pump goes from a higher to lower voltage. To reduce abrupt kickback current to the voltage supply, this excess charge may be dissipated internally in the integrated circuit that encompasses the charge pump. The current for the headphone load may be provided by charge pump supply voltages, such as VDDCP and VSSCP. By extending the period of hold time in a higher voltage mode during mode transitions, the excess charge on the fly and/or hold capacitors may be dissipated by the current drain of the headphone load. This maximum time may also be calculated based on a maximum signal frequency and other efficiency considerations.

The asymmetric ramp rate, as shown in FIG. 5, comes from the fact that for lower to higher transitions, the charge pump 104 spends the minimum amount of time in the intermediate modes to reduce signal clipping while for higher to lower transition, the charge pump 104 spends the maximum amount of time in intermediate modes to dissipate excess charge on chip.

Figure 6A:
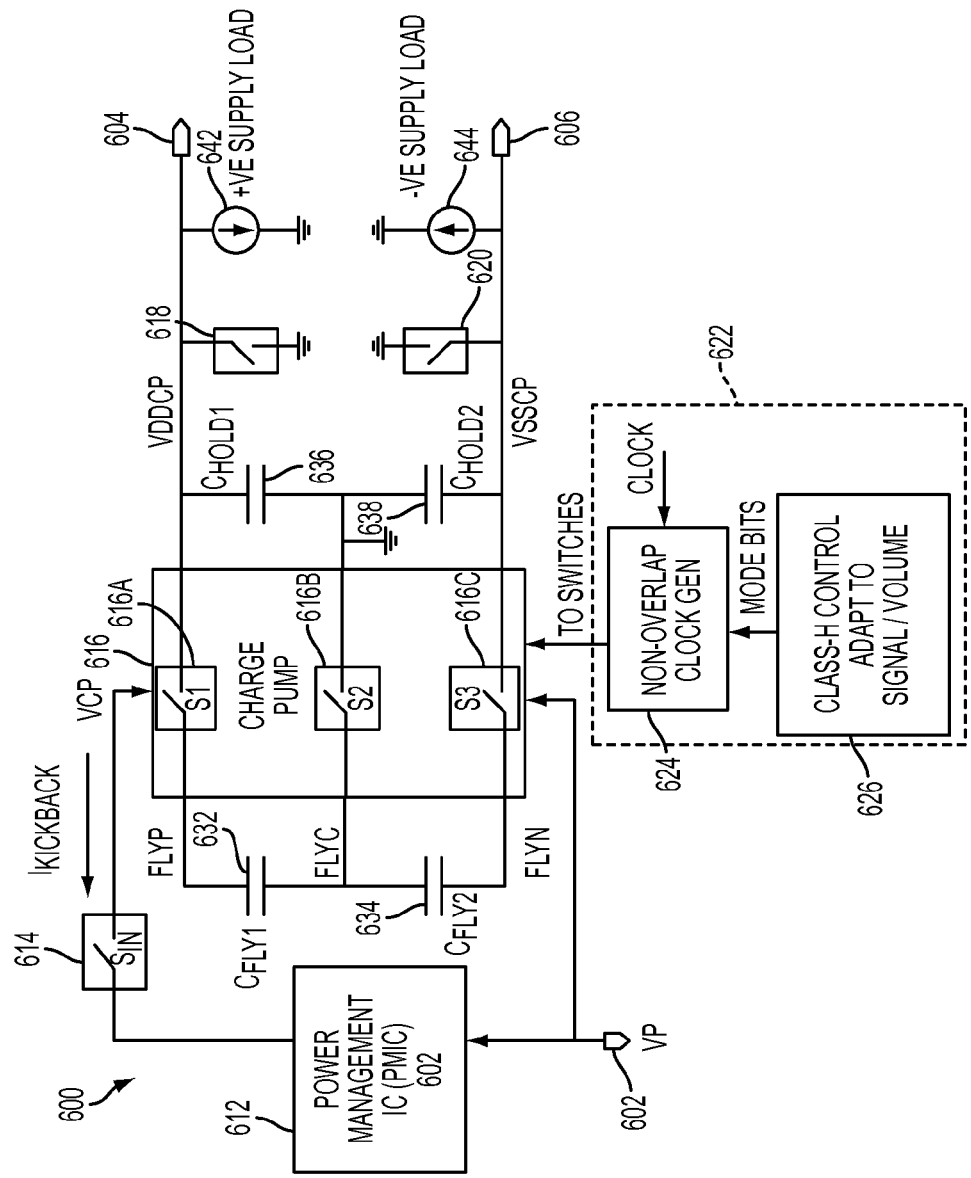
FIG. 6A is a block diagram illustrating an amplifier system for transitioning between modes with intermediate steps according to one embodiment of the disclosure.

Mode sequencing and asymmetric ramp rates, implemented in an integrated circuit, may allow the power supply provided to the charge pump to experience reduced abrupt voltage and/or current changes during mode transitions while playing back audio signals on headphone amplifier 106. FIG. 6A is a block diagram illustrating an amplifier system for transitioning between modes with intermediate steps according to one embodiment of the disclosure. An amplifier system 600 may include a voltage controller 612, such as a power management integrated circuit (PMIC). A voltage supply input node 602 may couple the voltage controller 612 to a power supply (not shown), such as a battery. The controller 612 may be coupled to a charge pump 616 through an input switch 614. The switch 614 may be, for example, a transistor or a buffer. The charge pump 616 may include switches 616A, 616B, and 616C, which may be operated during a mode change of the charge pump 616 from one voltage mode to another voltage mode.

The switches 616A, 616B, and 616C of the charge pump 616 may be coupled to fly capacitors 632 and 634 at a FLYP node at a side of the capacitor 632 opposite the capacitor 634, at a FLYC node between the capacitors 632 and 634, and at a FLYN node at a side of the capacitor 634 opposite the capacitor 632. The switches 616A and 616C may be coupled to a hold capacitor 636 and a hold capacitor 638, respectively. The switch 616B may couple the FLYC node between the capacitors 632 and 634 to a ground.

The charge pump 616 may provide a first voltage output node 604, for VDDCP, and a second voltage output node 606, for VSSCP. Although two output nodes 604 and 606 are shown, the charge pump 616 may provide a single output node or multiple output nodes. Loads 642 and 644 may be coupled to the output nodes 604 and 606, respectively. The loads 642 and 646 may be, for example, a headphone or other output device. The hold capacitors 636 and 638 may provide the voltage to the loads 642 and 644 for driving the headphones. During mode transitions, the hold capacitors 636 and 638 may be drained through the loads 642 and 644. Switches 618 and 620 may be coupled to the output nodes 604 and 606 and may be activated to discharge the capacitors 636, 638, 632 and 634 in addition or in alternate to discharging the capacitors 636, 638, 632 and 634 through the loads 642 and 644.

The charge pump 616 may be controlled by a control system 622. The control system 622 may include a class H controller 626 coupled to a non-overlap clock generator 624, which is coupled to the charge pump 616. The controller 626 may control the charge pump 616 to transition through charge pump mode changes. The transitions may be initiated to adapt to changes in an audio signal amplitude or a volume level of the amplifier system 600.

Reduction or elimination of kickback current may be obtained through the switch 614 of amplifier system 600. The switch 614 provides a high impedance path to prevent current flow from the charge pump 616 to the controller 612. For example, the switch 614 may be switched off to a high impedance path during a negative voltage slope transition. When the switch 614 is on the switch 614 is in a conducting or low impedance path state. When the switch 614 is off the switch 614 is in a non-conducting or high impedance path state.

Some remaining excess charge on the fly capacitors 632 and 634 and the hold capacitors 636 and 638 may still be discharged back to the controller 612 when the switch 614 is switched on to create a low impedance path. To further reduce kickback current to the controller 612 when the switch 614 switches off to create a high impedance path a defined load may be added to the capacitors 632, 634, 636, and 638. The defined load may be used while the switch 614 is switched off to reduce or eliminate excess charge on the capacitors 632, 634, 636, and 638 before switching on the switch 614.

Figure 6B:
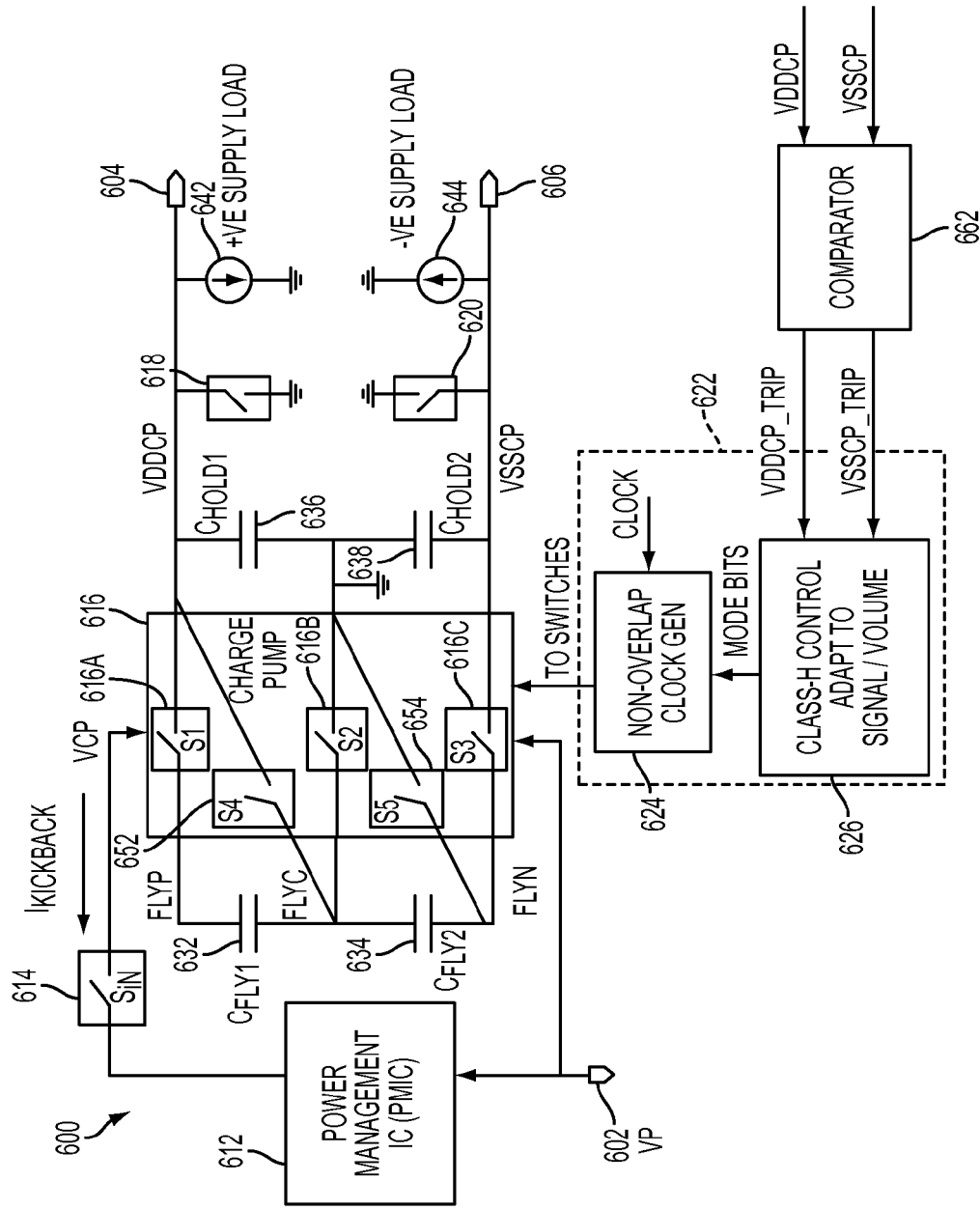
FIG. 6B is a block diagram illustrating an amplifier system for transitioning between modes with intermediate steps according to several embodiments of the disclosure.

In one embodiment, as illustrated in FIG. 6B, additional switches may be incorporated into the charge pump 616, including switch 652 and switch 654. The switch 652 may couple the FLYC node with the positive charge pump output voltage node 604, VDDCP. The switch 654 may couple the FLYN node with the charge pump ground. In one embodiment, charge steering may include waiting for the load 642 and 644 to discharge the VDDCP or VSSCP voltages until one of the VDDCP and VSSCP voltages reaches the target voltage. Then, a first group of switches, including the switches 616A, 616B, 616C, and a second group of switches, the switches 652 and 654, may be sequentially toggled until both the VDDCP and VSSCP voltages reach the target voltage. In certain embodiments, the switches 616A, 616B, 616C, 652, and 654 may be toggled independently. In another embodiment, charge steering may include continuously sequentially toggling the first group of switches, including the switches 616A, 616B, 616C, and the second group of switches, including the switches 652 and 654, until both VDDCP and VSSCP reach the target voltage.

Figure 7:
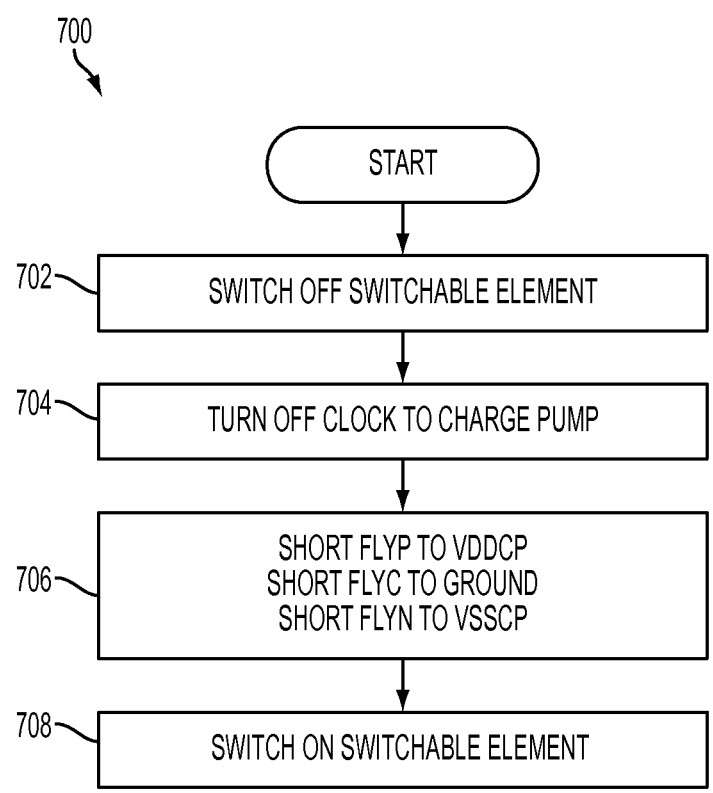
FIG. 7 is a flow chart illustrating operation of the amplifier system with a defined load according to one embodiment of the disclosure.

FIG. 7 is a flow chart illustrating operation of the amplifier system with a defined load according to one embodiment of the disclosure. The method of FIG. 7 is described with reference to the amplifier system 600 of FIG. 6B, however the method of FIG. 7 may be implemented in other circuits. A method 700 begins at block 702 with switching off the switch 614 to create a high impedance path from the charge pump 616 to the controller 612. At block 704, the clock to the charge pump 616 may be shut off, and at block 706, the switches 616A, 616B, and 616C may be configured to short node FLYP to VDDCP, short node FLYC to ground, and short node FLYN to VSSCP, respectively. In this state, the capacitors 632, 634, 636, and 638 may reach a steady state at a determined voltage that facilitates an easy transition to the next mode.

In one embodiment, at block 706 the load switches 618 and 620 may be switched on to dissipate excess charge from the capacitors 632, 634, 636, and 638. The excess load current provided by the switches 618 and 620 may be the value of the VDDSP or VSSCP voltage divided by the resistance of the switches 618 and 620, respectively. The load of the switches 618 and 620 may be in addition to the loads 642 and 644 to increase the rate of discharge of excess charge on the capacitors 632, 634, 636, and 638. Then, at block 708 the switch 614 may be switched on to provide a low impedance path from the controller 612 to the charge pump 616. Kickback current to the controller 612 may be reduced or eliminated by the method 700.

Figure 8:
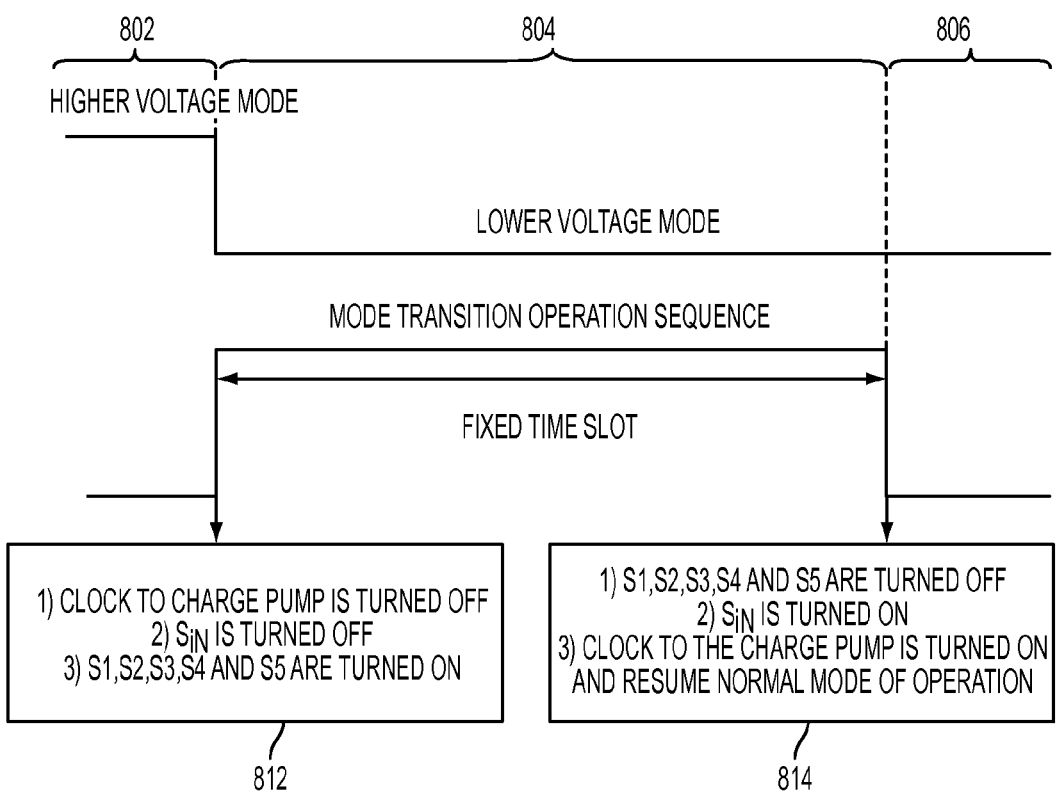
FIG. 8 is a graph illustrating operation of the amplifier system from a higher voltage mode to a lower voltage mode according to one embodiment of the disclosure.

FIG. 8 is a graph illustrating operation of the amplifier system from a higher voltage mode to a lower voltage mode according to one embodiment of the disclosure. A mode change from a higher voltage mode 802 to a lower voltage mode 806 may include a transition period 804 between the modes 802 and 806. At the beginning of the transition 804 steps 812 may be taken, including turning off a clock to the charge pump 616, turning off the switch 614, and turning on switches 616A, 616B, 616C, 652, and 654. At the end of the transition 804 steps 814 may be taken, including turning off switches 616A, 616B, 616C, 652, and 654, turning on switch 614, and turning on the clock to the charge pump 616.

The defined load solution described in FIG. 7 may dissipate excess charge through the switches 618 and 620 as electric charge to ground. This discharge may be undesirable. Furthermore, the combined load of the switches 618 and 620 and the loads 642 and 644 may allow the VDDCP and VSSCP voltages to discharge to lower than the target value of the next mode of the charge pump 616. Additionally, variances in the capacitance values of the capacitors 632, 634, 636, and 638, such as from manufacturing variability, and variances in a voltage from the voltage controller 612 may cause the final charge level when the switch 614 is switched off at block 708 to vary from one transition to another and from one amplifier to another. A closed loop feedback mode may be used to monitor the output voltages of VDDCP and VSSCP. The monitored voltages may be used to trigger events that cause activating or deactivating switches 616A, 616B, 616C, 618, 620, 652, and 654 and the switch 614.

The switches 652 and 654, along with other switches, may be enabled and disabled based on signals from the controller 622. The controller 622 may receive signals, such as VDDCP_trip and VSSCP_trip, from a comparator 662. The comparator 622 may generate the signals VDDCP_trip and VSSCP_trip by comparing the VDDCP and VSSCP voltages to reference voltages, as described in further detail below.

Figure 9:
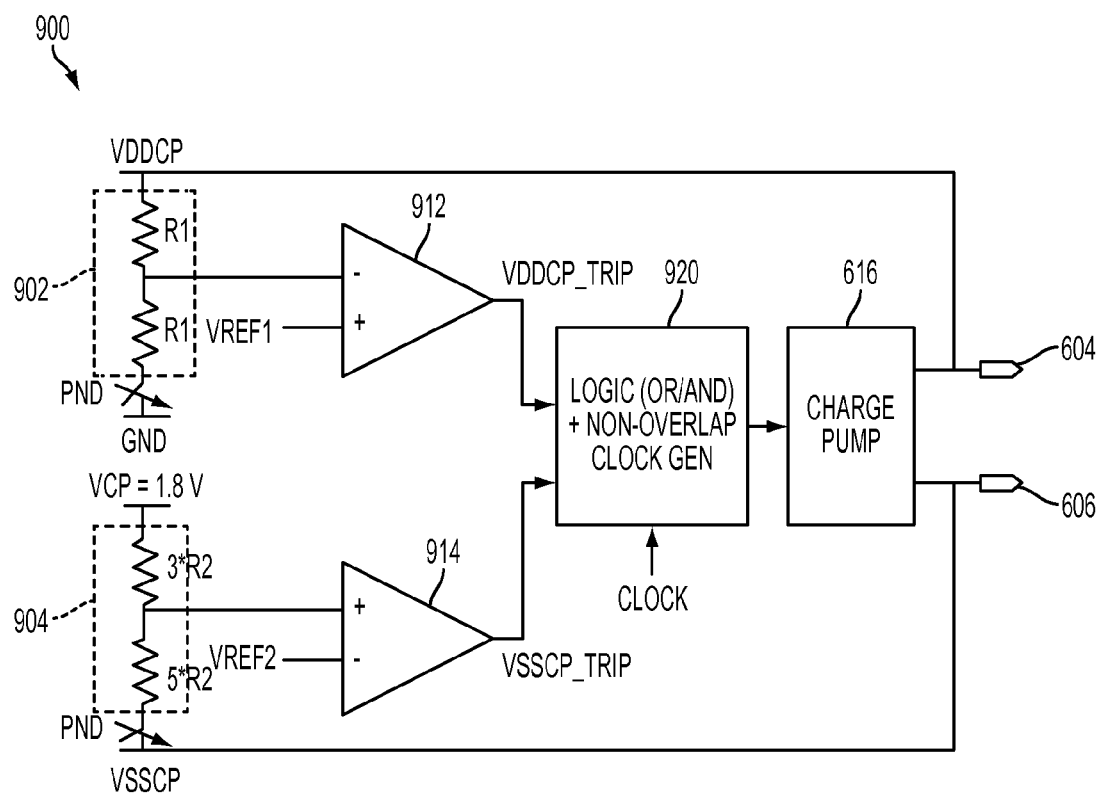
FIG. 9 is a block diagram illustrating a closed feedback loop for controlling a charge pump transitioning between modes according to one embodiment of the disclosure.

FIG. 9 is a block diagram illustrating a closed feedback loop for controlling a charge pump transitioning between modes according to one embodiment of the disclosure. A closed feedback loop 900 for monitoring capacitor discharge may include a first voltage divider 902 and a second voltage divider 904. The voltage dividers 902 and 904 may divide a first output VDDCP and second output VSSCP of the charge pump 616 of FIG. 6B, respectively. The output of the voltage dividers 902 and 904 may be provided to analog comparators 912 and 914, respectively. The analog comparators 912 and 914 may compare the voltage divided charge pump outputs with a first reference voltage and a second reference voltage, respectively. Reference voltages for various modes of the charge pump may be calculated from:

$$V_{ref1} = 0.5 * V_{final}, \text{ and}$$

$$V_{ref2} = (0.625 * V_{CP}) - (0.375 * V_{final}),$$

where $V_{final}$ is a final voltage value for an output of the charge pump.

The comparators 912 and 914 may generate binary trip signals VDDCP_trip and VSSCP_trip, respectively, that are provided to logic circuitry 920. The logic circuitry 920 may include, for example, logic gates including and/or gates, and/or a non-overlap clock generator. The output of the logic circuitry 920 may be coupled to the charge pump 616 to provide switching signals to the switches of the charge pump 616 of FIG. 6B.

Figure 10:
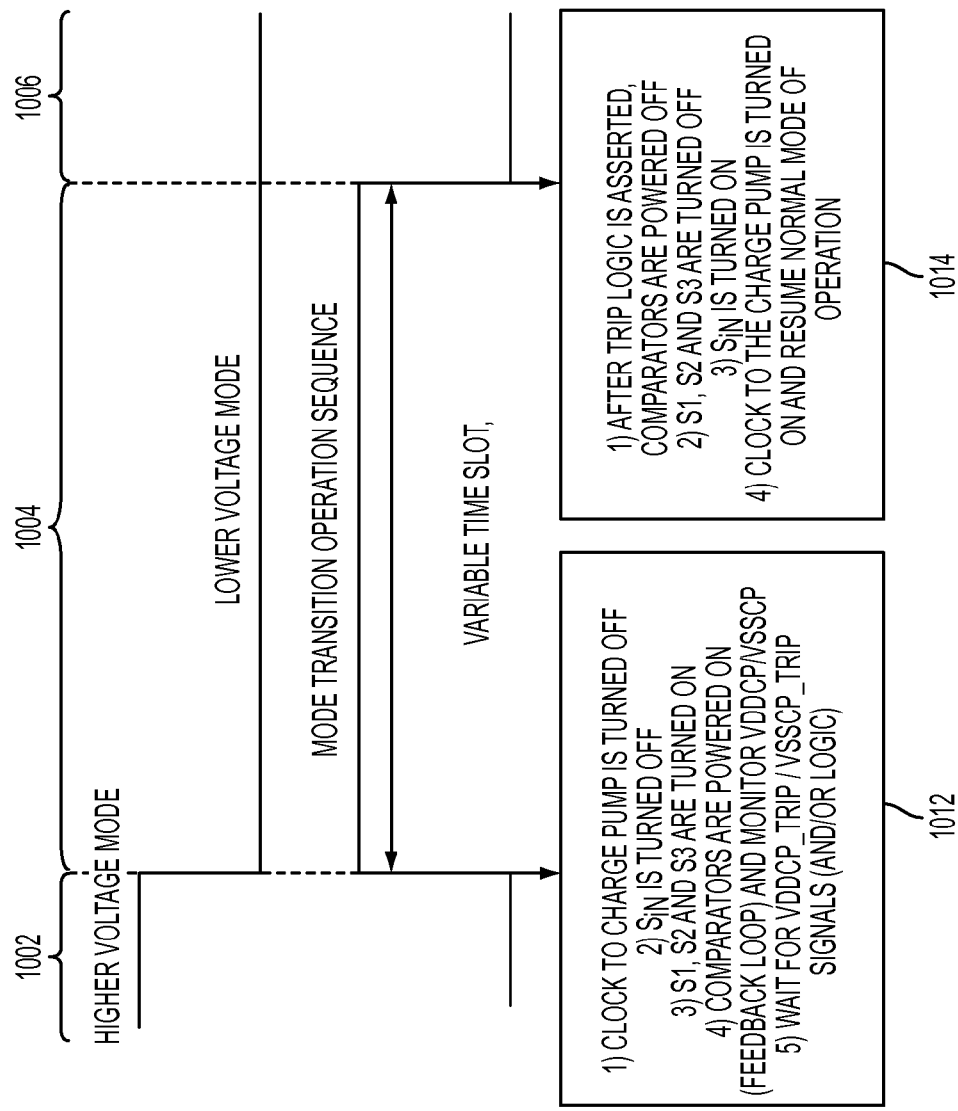
FIG. 10 is a graph illustrating operation of the amplifier system from a higher voltage mode to a lower voltage mode with a closed feedback loop according to one embodiment of the disclosure.

FIG. 10 is a graph illustrating operation of an amplifier system from a higher voltage mode to a lower voltage mode with a closed feedback loop according to one embodiment of the disclosure. A mode change from a higher voltage mode 1002 to a lower voltage mode 1006 may include a transition period 1004 between the modes 1002 and 1006. At the beginning of the transition 1004 steps 1012 may be taken, including turning off a clock to the charge pump 616, turning off switch 614, turning on switches 616A, 616B, and 616C, turning on comparator 662, and waiting for one or both of the trip signals VDDCP_trip and VSSCP_trip. At the end of the transition steps 1014 may be taken, including turning off comparator 662, turning off switches 616A, 616B, and 616C, turning on switch 614, and turning on the clock to the charge pump 616 to resume normal mode of operation of the amplifier system 600.

Figure 11A:
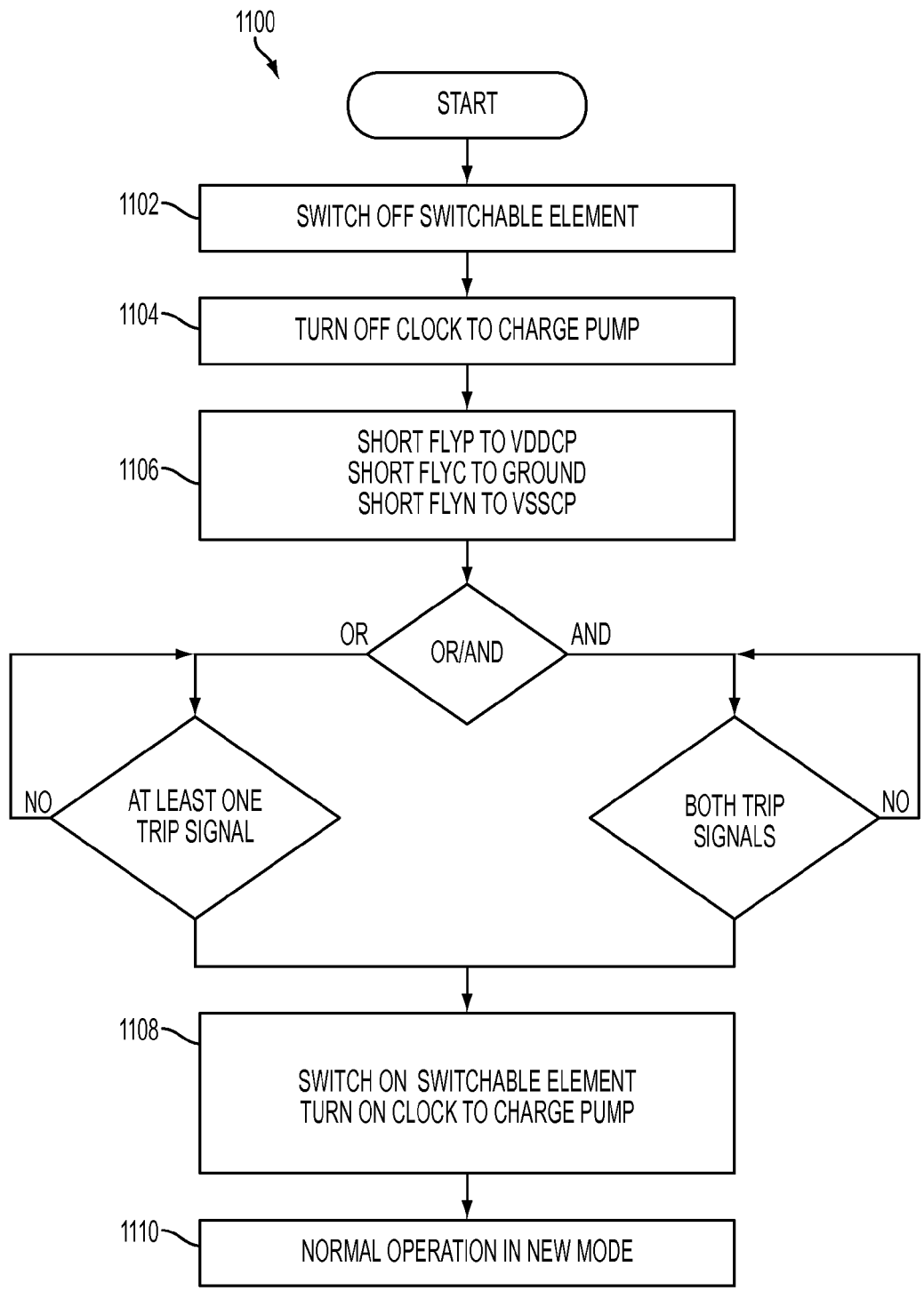
FIG. 11A is a flow chart illustrating a method for operating a charge pump with a closed feedback loop according to one embodiment of the disclosure.

FIG. 11A is a flow chart illustrating a method for operating a charge pump with a closed feedback loop according to one embodiment of the disclosure. The method of FIG. 11A is described with reference to the amplifier system 600 of FIG. 6B, however the method of FIG. 11A may be implemented in other circuits. A method 1100 starts at block 1102 with switching off the switch 614 to create a high impedance path and disconnect the charge pump 616 from the controller 612. At block 1104, the clock to the charge pump 616 is turned off. Then, at block 1106, node FLYP is shorted to VDDCP, node FLYC is shorted to ground, and node FLYN is shorted to VSSCP through operating switches of the charge pump 616. In certain other embodiments, FLYP may not be shorted to VDDCP in all modes. The configuration of switches after block 1106 may result in a steady state condition having charge on the fly capacitors 632 and 634 approximately equal to the charge on the hold capacitors 636 and 638, because the capacitor 632 is in parallel with the capacitor 636 between VDDCP and ground and the capacitor 634 is in parallel with the capacitor 638 between VSSCP and ground. The switches 618 and 620 may be switched off or not present, such that charge of the capacitors 632, 634, 636, and 638 is dissipated only through the loads 642 and 644, to headphones, and through quiescent power dissipation of the amplifier system 600.

The outputs of the charge pump 616, VDDCP and VSSCP, may be voltage divided and level shifted to a lower value and input to comparators 912 and 914 of FIG. 9. The comparators 912 and 914 compare the voltage divided and level shifted signals to reference signals. When the signals pass the amplitude of the reference voltage, the comparators 912 and 914 may switch from a '0' output to a '1' output, or vice versa. The reference voltages may be selected such that the voltage at VDDCP and VSSCP is equal to the target mode, taking into account the level shifting and voltage divide ratios. The logic circuitry 920 may determine when either one or both of the comparators 912 and 914 output a trip signal.

In one embodiment, the logic circuitry 920 may implement an OR selection gate, in which at least one of the VDDCP_trip and VSSCP_trip signals may trip the logic circuitry 920. When either one of the trip signals is generated, the method 1100 proceeds to block 1108 to switch on the switch 614 to create a low impedance path, turn on the clock signal to the charge pump 616, and return the charge pump 616 to normal operation in the new mode at block 1110. When the switch 614 is switched off, an excess charge may remain on one of the capacitors 632, 634, 636, and 638, because only one of either the comparators 912 and 914 generated a trip signal. This excess charge may result in a small kickback current to the controller 612. However, because only one trip signal was generated the VDDCP and VSSCP voltages may be higher than the signal levels and there may be no signal clipping during mode transition.

In another embodiment, the logic circuitry 920 may implement an AND selection gate, in which both the VDDCP_trip and VSSCP_trip signals must trip to trip the logic circuitry 920. After both trip signals are generated, the method 1100 proceeds to block 1108 to switch off the switch 614, turn on the clock signal to the charge pump 616, and return the charge pump 616 to normal operation in the new mode at block 1110. Because approximately all excess charge has been dissipated from the capacitors 632, 634, 636, and 638, there may be little or no kickback current from the charge pump 616 to the controller 612. However, if the VDDCP and VSSCP voltages discharge asymmetrically, then one of the VDDCP or VSSCP voltages may drop below the target voltage while the other of the VDDCP and VSSCP voltages decreases to the target voltage. As a result, there may be some signal clipping during mode transition until the capacitors 636 and 638 reach target voltage levels.

Figure 11B:
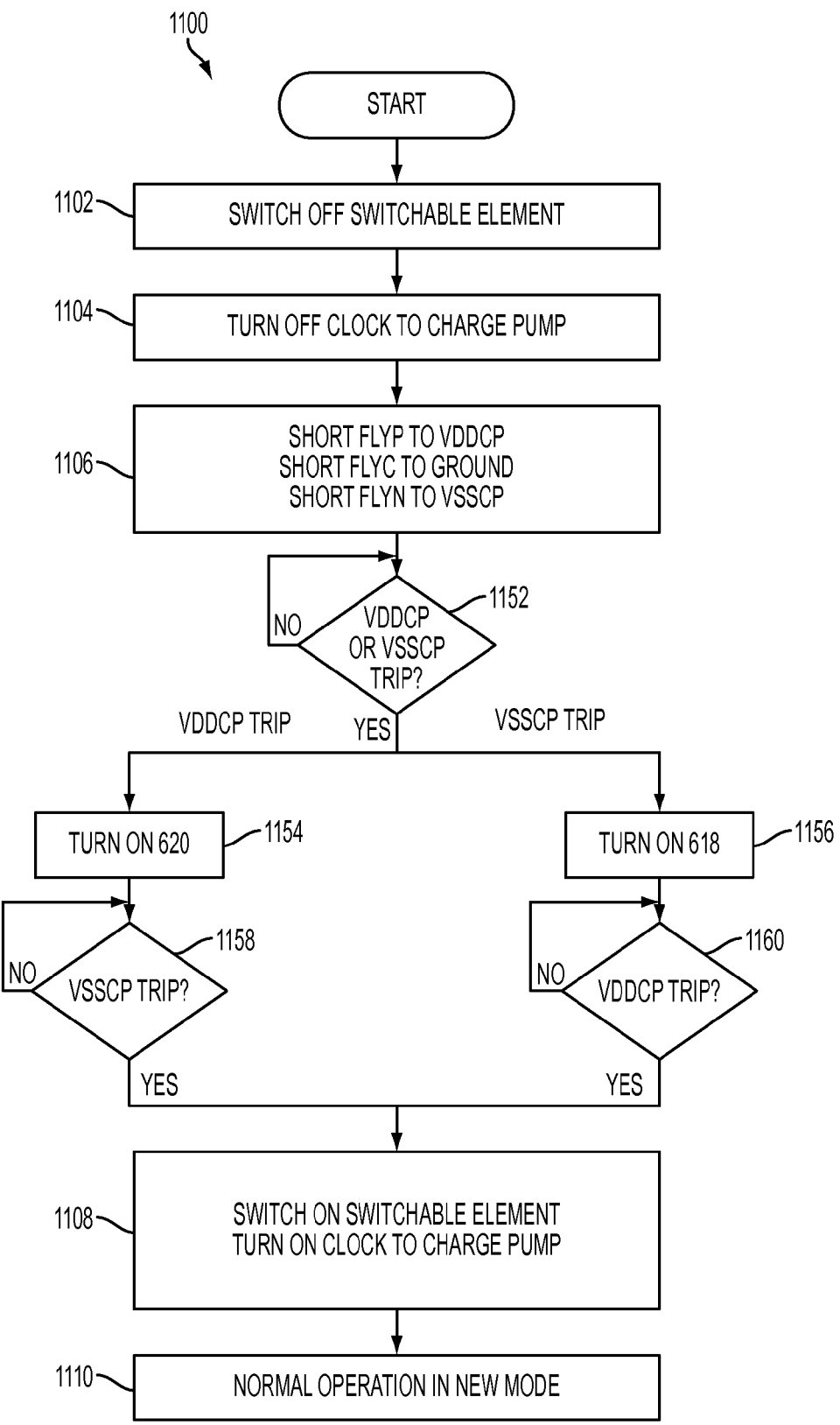
FIG. 11B is a flow chart illustrating a method for operating a charge pump with a closed feedback loop and accelerated discharge according to one embodiment of the disclosure.

Whether an OR selection gate or an AND selection gate is used in the logic circuitry 920, after one of the VDDCP and VSSCP voltages reach the target voltage level, the discharge of the other of the VDDCP and VSSCP voltages may be accelerated to reach the target voltage level. FIG. 11B is a flow chart illustrating a method for operating a charge pump with a closed feedback loop and accelerated discharge according to one embodiment of the disclosure. In FIG. 11B, the method 1100 proceeds to block 1152 to determine whether VDDCP or VSSCP tripped. If VDDCP tripped, then the method 1100 proceeds to block 1154 to turn on switch 620 to drain charge from VSSCP until VSSCP trips at block 1158. Then, the method 1100 proceeds to block 1108. If VSSCP tripped first, then the method 1100 proceeds to block 1156 to turn on switch 618 to drain charge from VDDCP until VDDCP trips at block 1160. Then, the method 1100 proceeds to block 1108 as in FIG. 11A.

In certain embodiments, charge steering may be performed to redistribute charge among the capacitors 632, 634, 636, and 638. Redistribution of the charge may decrease the time period for a mode transition while waiting for the second of VDDCP and VSSCP to reach a target voltage. Additional switches within the charge pump 616 may be used to redistribute charge between the capacitors 632, 634, 636, and 638. Referring to FIG. 6B when transitioning between modes, the switch 614 may be switched off and switches 616A, 616B, and 616C switched on as in the examples described above. In a further embodiment, current steering may be performed when the switch 614 is turned off by steering the charge pump 616 with a pre-defined sequence as if it is already in steady-state operation for the new mode until both the VDDCP and VSSCP voltages reach the target value.

In another embodiment, as illustrated in FIG. 6B, additional switches may be incorporated into the charge pump 616, including switch 652 and switch 654. The switch 652 and switch 654 will couple capacitor 634 with capacitor 636 and capacitor 632. The switch 616B and 616C will couple capacitor 634 and capacitor 638. By switching capacitor 634 in parallel with capacitor 636 in one phase, and switching capacitor 634 in parallel with capacitor 638 in a different phase, the charge redistribution between capacitor 632, capacitor 636, capacitor 634 and capacitor 638 could be reached. In one embodiment, charge steering may include waiting for the load 642 and 644 to discharge the capacitor 632, capacitor 636, capacitor 634 and capacitor 638 until one of the VDDCP and VSSCP voltages reaches the target voltage indicating by block 662 of FIG. 6B. Then, a first group of switches, including the switches 616A, 616B, 616C, and a second group of switches, the switches 652 and 654, may be sequentially toggled until both the VDDCP and VSSCP voltages reach the target voltage indicating by block 662 of FIG. 6B. In certain embodiments, the switches 616A, 616B, 616C, 652, and 654 may be toggled independently. In another embodiment, charge steering may include continuously sequentially toggling the first group of switches, including the switches 616A, 616B, 616C, and the second group of switches, including the switches 652 and 654, until both VDDCP and VSSCP reach the target voltage.

Various circuits and methods have been described above to reduce or eliminate kickback current from the charge pump 616 to the controller 612 during charge pump mode transitions. A series switch between the charge pump 616 and the controller 612 to block kickback current to the controller 612. Additional loads may be coupled to the VDDCP and VSSCP outputs to dissipate excess charge on the capacitors 632, 634, 636, and 638. A closed loop feedback system may also be implemented to monitor voltages on the VDDCP and VSSCP output during mode transitions. Each of the features for reducing or eliminated charge pump kickback current may be used in combination or alone in an amplifier system to reduce kickback current from the charge pump.

If implemented in firmware and/or software, the operations described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
a charge pump comprising a first charge pump output node;
a charge pump voltage controller coupled to a voltage input of the charge pump and coupled to a supply voltage input node, wherein the charge pump voltage controller is configured to control an input voltage level to the voltage input of the charge pump by regulating a supply voltage received at the supply voltage input node;
an input switch coupled between the charge pump voltage controller and the voltage input of the charge pump; and
an amplifier controller configured to transition the charge pump from a higher voltage mode to a lower voltage mode and configured to provide a high impedance path during a transition period between the higher voltage mode and the lower voltage mode.

2. The apparatus of claim 1, wherein the input switch comprises at least one of a switch and a buffer, wherein the input switch is configured to create at least a high impedance path and a low impedance path between the charge pump voltage controller and the charge pump.

3. The apparatus of claim 1, wherein the amplifier controller is configured to transition the charge pump from the higher voltage mode to the lower voltage mode to adapt to at least one of an input signal and a volume level of the amplifier.

4. The apparatus of claim 1, wherein the charge pump further comprises a second charge pump output node.

5. The apparatus of claim 4, further comprising:
a first capacitor coupled to the first charge pump output node and to a ground;
a second capacitor coupled to the second charge pump output node and to the ground; and
a load coupled to the first charge pump output node and the second charge pump output node, wherein the load is configured to drain at least one of the first capacitor and the second capacitor during at least a portion of time during the transition from the higher voltage mode to the lower voltage mode.

6. The apparatus of claim 5, further comprising:
a first switch coupled to the first charge pump output node and to a ground; and
a second switch coupled to the second charge pump output node and to the ground.

7. The apparatus of claim 6, wherein the amplifier controller is configured to control the first switch and the second switch to discharge the first capacitor and the second capacitor, respectively, during at least a portion of the transition between the higher voltage mode and the lower voltage mode.

8. The apparatus of claim 6, wherein the amplifier controller is configured to redistribute charge between the first capacitor and the second capacitor.

9. The apparatus of claim 5, further comprising:
a third capacitor coupled to the first charge pump output node; and
a fourth capacitor coupled to the second charge pump output node,
a first switch coupled between the third capacitor and the first charge pump output node;
a second switch coupled between the third capacitor, the fourth capacitor, and the ground; and
a third switch coupled between the fourth capacitor and the second charge pump output node.

10. The apparatus of claim 9, wherein the amplifier controller is configured to perform the following steps during at least a portion of the transition of the charge pump from the higher voltage mode to the lower voltage mode:
configure the input switch to provide a high impedance path to reduce kickback current to the voltage controller; and
switch on the first switch, the second switch, and the third switch to drain charge from the third capacitor and the fourth capacitor by coupling the third capacitor and the fourth capacitor to the first capacitor and the second capacitor, respectively, to discharge the third capacitor and the fourth capacitor in parallel with the first capacitor and the second capacitor.

11. The apparatus of claim 4, further comprising:
a first capacitor coupled to the first charge pump output node and a ground;
a second capacitor coupled to the second charge pump output node and the ground;
a first comparator comprising a first input coupled to a signal proportional to the first charge pump output node and a second input coupled to a first reference voltage; and
a second comparator comprising a first input coupled to a signal proportional to the second charge pump output node and a second input coupled to a second reference voltage.

12. The apparatus of claim 11, further comprising:
a third capacitor coupled to the first charge pump output node and a common node;
a fourth capacitor coupled to the second charge pump output node and the common node;
a first switch coupled between the third capacitor and the first charge pump output node;
a second switch coupled between the common node and the ground; and
a third switch coupled between the fourth capacitor and the second charge pump output node.

13. The apparatus of claim 12, wherein the amplifier controller is configured to perform the following steps during a transition of the charge pump from high voltage mode to a low voltage mode:
configure the input switch to provide a high impedance path to reduce kickback current to the voltage controller; and
switch on the first switch, the second switch, and the third switch to drain charge from the third capacitor and the fourth capacitor by coupling the third capacitor and the fourth capacitor to the first capacitor and the second capacitor, respectively, to discharge the third capacitor and the fourth capacitor in parallel with the first capacitor and the second capacitor.

14. The apparatus of claim 12, further comprising logic circuitry coupled to the first comparator and coupled to the second comparator and coupled to the charge pump, wherein the logic circuitry is configured to monitor the first charge pump output node and the second charge pump output node and generate a trip signal when at least one of the first comparator and the second comparator indicate at least one of the first charge pump output node and the second charge pump output node have discharged to approximately a voltage value for operation in the low voltage mode.

15. The apparatus of claim 14, wherein the amplifier controller is configured to perform the following steps when the trip signal is generated:
configure the input switch to provide a high impedance path to reduce kickback current to the voltage controller; and
switch off the first switch, the second switch, and the third switch to drain charge from the third capacitor and the fourth capacitor by coupling the third capacitor and the fourth capacitor to the first capacitor and the second capacitor, respectively, to discharge the third capacitor and the fourth capacitor in parallel with the first capacitor and the second capacitor.

16. The apparatus of claim 14, wherein the amplifier controller is configured to redistribute charge between the first capacitor and the second capacitor.

17. The apparatus of claim 16, wherein the fourth capacitor is configured to redistribute charge with the first capacitor in a first phase, and the fourth capacitor is configured to redistribute charge with the second capacitor in a different second phase, until voltages on the first capacitor and the second capacitor have discharged to approximately the lower voltage mode.

18. The apparatus of claim 14, further comprising:
a fourth switch coupled to the common node and coupled to the first charge pump output node; and
a fifth switch coupled to the second capacitor and coupled to the ground.

19. The apparatus of claim 18, wherein the amplifier controller is configured to:
detect when the trip signal is generated; and
toggle, after the trip signal is generated, the second switch, the third switch, and the fourth switch as a first set of switches and the fifth switch and the sixth switch as a second set of switches until the logic circuitry indicates that both the first capacitor and the second capacitor have discharged to the approximate charge level of the lower voltage mode.

20. The apparatus of claim 18, wherein the amplifier controller is configured to toggle the second switch, the third switch, and the fourth switch as a first set of switches and the fifth switch and the sixth switch as a second set of switches until the logic circuitry indicates that both the first capacitor and the second capacitor have discharged to the approximate charge level of the lower voltage mode.

21. The apparatus of claim 14, wherein the amplifier controller is further configured to perform the step of at least one of:
increasing a discharge rate of the second capacitor when the first capacitor has reached approximately the voltage value of lower voltage mode; and
increasing a discharge rate of the first capacitor when the second capacitor has reached approximately the voltage value of lower voltage mode.

22. The apparatus of claim 12, wherein the amplifier controller is configured to:
configure the switch to provide a high impedance path; and
operate the charge pump according to a steady-state condition to allow the first charge pump output node and the second charge pump output node to decrease to approximately a target voltage for the low voltage mode.

23. A method, comprising:
providing, from a charge pump voltage controller, a charge pump supply voltage to a charge pump through an input switch, wherein the charge pump supply voltage is supplied to a voltage input of the charge pump by regulating a supply voltage;
disconnecting, by the input switch coupled between the charge pump voltage controller and the charge pump, the charge pump from the charge pump supply voltage to provide a high impedance path between the charge pump and the charge pump supply voltage; and
transitioning, by the charge pump voltage controller, the charge pump from a first higher voltage mode to a second lower voltage mode after disconnecting the charge pump from the charge pump supply voltage such that the input switch provides the high impedance path during a transition period between the higher voltage mode and the lower voltage mode.

24. The method of claim 23, further comprising:
discharging a first capacitor coupled to a first charge pump output node of the charge pump through a first amplifier load to reach approximately a target value of the second lower voltage mode; and
discharging a second capacitor coupled to a second charge pump output node of the charge pump through a second amplifier load to reach approximately a target value of the second lower voltage mode.

25. The method of claim 24, further comprising:
discharging the first capacitor through a first additional load in parallel with the first amplifier load; and
discharging the second capacitor through a second additional load in parallel with the second amplifier load.

26. The method of claim 24, further comprising redistributing charge between the first capacitor and the second capacitor.

27. The method of claim 24, further comprising:
monitoring a discharge of the first capacitor coupled to the first charge pump output node of the charge pump to determine when the first charge pump output node reaches the target value of the second lower voltage mode; and
monitoring a discharge of the second capacitor coupled to the second charge pump output node of the charge pump to determine when the second charge pump output node reaches the target value of the second lower voltage mode.

28. The method of claim 27, further comprising:
when the first capacitor has reached the lower voltage mode, increasing a discharge rate of the second capacitor; and
when the second capacitor has reached the lower voltage mode, increasing a discharge rate of the first capacitor.

29. The method of claim 28, further comprising redistributing charge between the first capacitor and the second capacitor.

30. An amplifier system, comprising:
a charge pump comprising:
a first charge pump output node;
a second charge pump output node;
a first switch coupled between a first node and the first charge pump output node;
a second switch coupled between a second node and a ground; and
a third switch coupled between a third node and the second charge pump output node;
a power management integrated circuit (PMIC) coupled to the charge pump and configured to provide a charge pump supply voltage to the charge pump by regulating a supply voltage received by the PMIC;
an input switch coupled between the PMIC and a charge pump supply voltage input of the charge pump; and
a controller coupled to the charge pump and configured to transition the charge pump from a higher voltage mode to a lower voltage mode and configured to configure the input switch as a high impedance path during a transition period between the higher voltage mode and the lower voltage mode.

31. The amplifier system of claim 30, comprising:
a first capacitor coupled to the first node and to the second node;
a second capacitor coupled to the second node and to the third node;
a third capacitor coupled to the first charge pump output node and to the ground;
a fourth capacitor coupled to the second charge pump output node and to the ground,
wherein the controller is configured to operate the first switch, the second switch, and the third switch to discharge the first capacitor, the second capacitor, the third capacitor, and the fourth capacitor during the transition from the higher voltage mode to the lower voltage mode.

32. The amplifier system of claim 31, wherein the controller comprises:
a clock generator coupled to the charge pump and configured to enable and disable the charge pump; and
a class-H controller configured to trigger a transition from a first higher voltage mode to a second lower voltage mode based, at least in part, on at least one of a signal level of an input signal and a volume level of the amplifier system.

33. The amplifier system of claim 31, further comprising a comparator coupled to the controller, coupled to the first charge pump output node, and coupled to the second charge pump output node, wherein the comparator is configured to:
compare the first charge pump output node to a first reference voltage;
compare the second charge pump output node to a second reference voltage;
when the first charge pump output node has reached approximately the second lower voltage mode, increasing a discharge rate of the third capacitor; and
when the second capacitor has reached approximately the second lower voltage mode, increasing a discharge rate of the fourth capacitor.

34. The amplifier system of claim 30, wherein configuring the input switch as a high impedance path comprises switching off the input switch.

* * * * *